Figure 1:
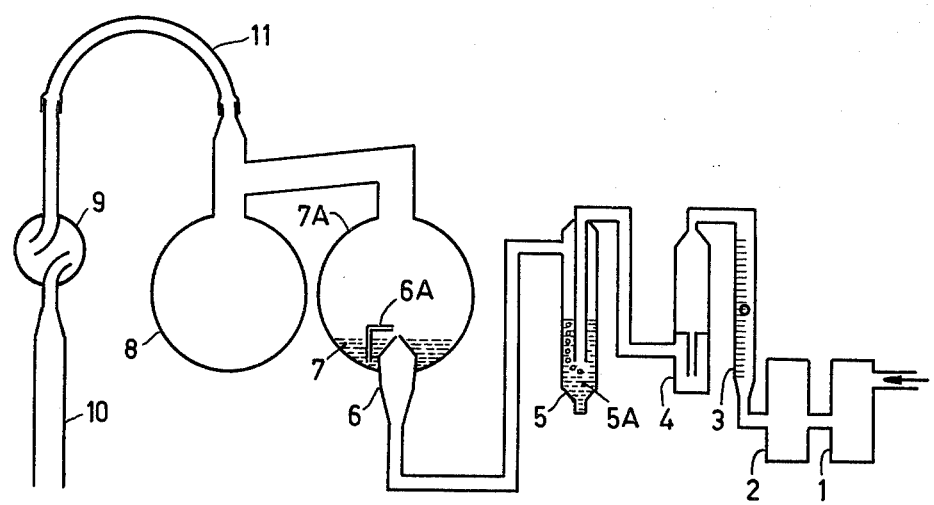

United States Patent [19]

Popma et al.

[11] 4,199,621
[45] Apr. 22, 1980

[54] METHOD OF PRODUCING IRON OXIDE PHOTO MASKS

[75] Inventors: Theo J. A. Popma; Maria G. J. Kamminga-Schrijnemakers, both of Eindhoven, Netherlands

[73] Assignee: U.S. Philips Corporation, New York, N.Y.

[21] Appl. No.: 872,171

[22] Filed: Jan. 25, 1978

[30] Foreign Application Priority Data

Jan. 27, 1977 [NL] Netherlands .......................... 7700808

[51] Int. Cl.² .......................... B05D 1/02; B05D 3/02
[52] U.S. Cl. .................................... 427/160; 427/164; 427/168
[58] Field of Search .................. 427/160, 164, 168

[56] References Cited

U.S. PATENT DOCUMENTS

| 3,824,100 | 7/1974 | Griest | 96/383 X |
| 3,984,591 | 10/1976 | Plumat et al. | 427/168 X |

Primary Examiner—James R. Hoffman
Attorney, Agent, or Firm—Norman N. Spain

[57] ABSTRACT

Method of producing photomasks of X-ray amorphous iron oxide ($Fe_2O_3$) by spraying a transparent substrate at a temperature between 180° and 250° C. with a solution of an hydrolysable iron salt in a polar organic solution or, in accordance with a variant of this method, at a temperature between 180° and 750° C. with a solution of a hydrolysable iron salt which also contains a salt of a metal having a greater ion diameter. If temperatures above approximately 230° C. are used, the solvent may in the latter case also consist of water only.

6 Claims, 3 Drawing Figures

U.S. Patent    Apr. 22, 1980    4,199,621

METHOD OF PRODUCING IRON OXIDE PHOTO MASKS

The invention relates to a method of producing a photo mask which is transmissive to visible light and not transmissive to ultraviolet light, consisting of a thin coating of iron oxide on a transparent support by spraying the support at elevated temperatures with a solution of a, at this temperature, hydrolysable iron salt and to iron oxide photo masks. A method of producing such a mask is, for example, disclosed in U.S. Pat. No. 3,824,100 to which reference is made for sofar as necessary. With this method a coating of $\alpha$-$Fe_2O_3$ is applied to a transparent support by spraying the substrate which is at a temperature of 625° C. with a solution of ferric chloride in water. $\alpha$-$Fe_2O_3$ is formed in these circumstances. Such a coating of $\alpha$-$Fe_2O_3$ has the drawback that it requires long etching times and that, owing to the crystalline character of the coating, the edge sharpness is not guaranteed sufficiently during etching. In addition the high working temperature is a drawback because there is the risk that the glass substrate wraps. In general, this method can therefore only be used for supplying masks of relatively small dimensions on substrates of glass which can withstand high working temperatures and the products which are released during the hydrolysis at this temperature. It has already been suggested (see U.K. Pat. No. 1,340,604) to deposit iron oxide masks at relatively low temperatures by means of pyrolysis of iron carbonyl compounds. This method has the drawback that explosive gas mixtures may form during the process. It is an object of the invention to obviate these difficulties.

The method according to the invention is therefore characterized in that the substrate is sprayed at a temperature between 180° and 250° C. of the substrate with a solution of a hydrolysable salt of trivalent iron in a polar organic solvent. Above 250° C. crystalline $\alpha$-$Fe_2O_3$ or $\beta$-$Fe_2O_3$ is disposited, below 180° C. no deposit of iron oxide is obtained within a reasonable period of time. It proved that when applying the invention a coating of X-ray-amorphous iron oxide ($Fe_2O_3$) is produced which allows sufficiently rapid and reliable etching with the customary etching means, that is to say with the edge sharpness required for conductors of small dimensions.

In the method according to the invention anhydrous ferric chloride ($FeCl_3$) is preferably used in a concentration of 5 to 15% by weight in a polar organic solvent, for which, for example, alcohols, esters and such like are suitable. A very suitable solvent appears to be butylacetate. The solution can be sprayed in air without the addition of water. It is, however, also possible to add water, for example by starting from $FeCl_3 \cdot 6H_2O$ or by adding some percents by volume of water to the solution. A suitable film thickness is 0.1 to 0.25 micrometers, although with the invented method coatings can be obtained having a thickness between 0.01 and 1 micrometer. Hydrochloric acid can, for example, be used as etchant. The transparent support may consist of soft glass, hard glass or quartz glass. In accordance with a variant of the invented method the solution of the inorganic iron salt to be volatilized comprises a quantity of a salt of a metal having a greater ion diameter than the ferric ion, which is soluble in the relevant solvent and the substrate is heated to a temperature between 180° and 750° C. It was found that in these circumstances X-ray-amorphous iron oxide coatings were deposited over the entire indicated temperature range. It also appeared that, especially at temperatures from 230° C. upwards, water can be used as a solvent. Preferably the salt of the metal having a greater ion diameter than the ferric ion is used in such a quantity that the ratio in gram ions of iron to other metal is between 95:5 to 60:40. The deposited coating of iron oxide also contains the ion of the other metal, however in such quantities that the etchability of the coating cannot be affected thereby. Suitable metal salts are, for example, the nitrates and chlorides of barium, yttrium, gadolinium, bismuth, lead and of the rare earth metals. It was found that with this variant of the method solvents from the group consisting of the ethylene glycol ethers such as glycol monethylether (2 ethoxy-ethanol) are very suitable. It was ascertained that when using these solvents the deposited coating of iron oxide contains the ion of the other metal of a greater ion radius in the same quantity relative to the ferric ion as in the starting mixture. For ester-solvents such as butylacetate and alcohols, such as propanol and ethanol this appeared not to be the case.

Figure 2:
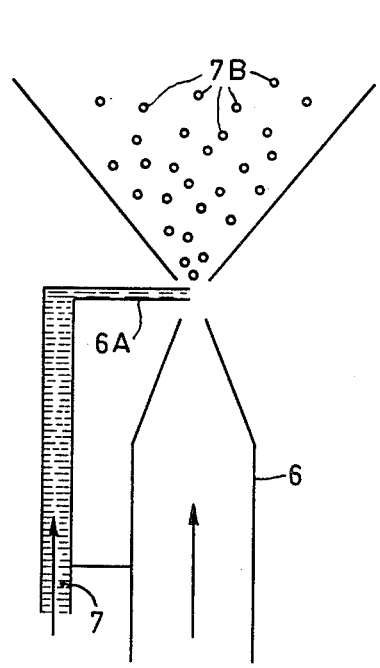
Figure 3:
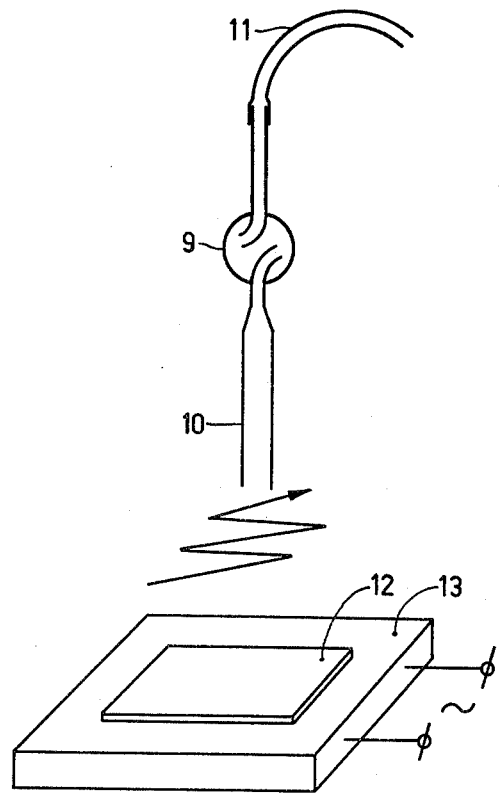

The method according to the invention will now be explained in greater detail with reference to the accompanying drawing and a number of examples. In the drawing FIG. 1 shows diagrammatically a part of an arrangement for obtaining an aerosol FIG. 2 shows diagrammatically a detail of the arrangement FIG. 3 shows diagrammatically and partly in a perspective view the production of an iron oxide coating.

In the direction indicated by the arrow air is passed through the arrangement shown in FIG. 1. The air passes, in this sequence, the rooms 1 and 2, in which dust can stay behind, the flow meter 3, a non-return bottle 4, the washing bottle 5 filled with solvent 5A which is used for the iron salt solution and wherein the air is wetted with this solvent. Thereafter the air flows through the atomizer arrangement 6–7 which is shown in detail in FIG. 2. The air flowing from the blower opening 6 flows along the opening of the suction tube 6A, an opening of which is inserted in the iron salt solution 7, which is in the sphere 7A. The air which flows along the other opening of the tube 6A sucks the solution and atomizes it whilst forming the aerosol 7B. Thereafter the aerosol 7B is passed thereafter through the sphere 8 where the biggest drops can stay behind and thereafter through the splash globe 9 to the nozzle 10. In the connection between 8 and 9 there is a flexible portion 11 (flexible tube) so that the nozzle can be moved across the glass plate 12 (FIG. 3) following a zig-zag line, the points at which the movement reverses always being outside the plane of the glass plate 12. The glass plate 12 is heated by means of the hot plate 13.

EXAMPLE I

A solution was prepared of 12.9 g anhydrous $FeCl_3$ in 100 ml of butylacetate and volatilized with air as shown in the Figure, the flow rate was approximately 10 l/minute. Before the air arrives in the atomizer 6–7 the air is wetted with butyl-acetate 5A in the washing bottle 5. The diameter of the blower opening 6 is 1 mm, of the exit opening of the capillary 6A: 0.5 mm. The glass plate is approximately 1 mm thick. Before spraying the glass plate is cleaned and degreased. The hot plate is stabilized through an electronic control (not shown) at a temperature of 230±1° C. The layer thickness can be measured during growing in a known manner by means of the colours which are produced owing to interference on reflection of light.

With the arrangement shown coatings 0.16 micrometer thick were produced, they consisted of X-ray amorphous $Fe_2O_3$, such coatings allowed etching within 1 minute with the required edge sharpness with a hydrochloric acid solution.

EXAMPLE II

In a similar manner a solution consisting of 30 g $Fe(NO_3)_3 \cdot 9H_2O$ and 3 g $Ba(NO_3)_2$ in 250 ml water was sprayed. The substrate 12 of hard glass was heated to 500° C. The $Fe_2O_3$ coating obtained was X-ray amorphous and allowed rapid etching with the required edge sharpness with a hydrochloric solution.

What is claimed is:

1. A method of producing a photomask, transmissive to visible light and non-transmissive to ultraviolet light and consisting essentially of a thin coating of iron oxide on a transparent support, comprising heating a transparent support to a temperature between 180° and 250° C. and spraying said heated support with a solution of a hydrolyzable salt of trivalent iron in a polar organic solvent.

2. The method of claim 1 wherein the solution contains 5 to 15% by weight of a hydrolyzable iron salt.

3. The method of claim 1 wherein the polar organic solvent is butyl acetate.

4. The method of producing a photomask, transmissive to visible light and non-transmissive to ultraviolet light and consisting essentially of a thin coating of iron oxide on a transparent support, comprising heating a transparent support to a temperature between 180° and 750° C. and spraying said heated support with a solution of a hydrolyzable salt of trivalent iron and a salt of a metal having an ion diameter greater than that of trivalent iron in a polar organic solvent.

5. The method of claim 4 wherein the polar organic solvent is an ethylene glycol ether.

6. The method of producing a photomask, transmissive to visible light and non-transmissive to ultraviolet light and consisting essentially of a thin coating of iron oxide on a transparent support, comprising heating a transparent support to a temperature between 230° and 750° C. and spraying said heated support with a solution of a hydrolyzable salt of trivalent iron and a salt of a metal having an ion diameter greater than that of trivalent iron in water.

* * * * *